United States Patent [19]

Kawakami

[11] Patent Number: 4,591,894

[45] Date of Patent: May 27, 1986

[54] SEMICONDUCTOR DEVICE HAVING A PLURALITY OF CMOS I/O CELLS LOCATED AT THE PERIPHERY OF THE CHIP ARRANGED IN A DIRECTION PERPENDICULAR TO THE SIDES OF THE CHIP

[75] Inventor: Susumu Kawakami, Yokohama, Japan

[73] Assignee: Tokyo Shibaura Denki Kabushiki Kaisha, Japan

[21] Appl. No.: 455,838

[22] Filed: Jan. 5, 1983

[30] Foreign Application Priority Data

Jan. 20, 1982 [JP] Japan .................................. 57-7146

[51] Int. Cl.[4] ...................... H01L 27/02; H01L 23/48
[52] U.S. Cl. ........................................ 357/42; 357/41; 357/68
[58] Field of Search ................ 357/68, 41, 42

[56] References Cited

U.S. PATENT DOCUMENTS 4,443,811  4/1984  Tubbs et al. .................... 357/42

FOREIGN PATENT DOCUMENTS 2508255  12/1982  France ............................. 357/42
2104284  3/1983  United Kingdom ............ 357/42

OTHER PUBLICATIONS

CMOS Design Manual (Interdesign) 1978, Chap. 5, Sec. 3, 2, The Buffer Cell, pp. 5–7.

Primary Examiner—Martin H. Edlow
Assistant Examiner—Terri M. Henn
Attorney, Agent, or Firm—Finnegan, Henderson, Farabow, Garrett & Dunner

[57] ABSTRACT

A semiconductor device comprises a gate array portion formed in the central portion of a chip, and a number of CMOS input/output cells arranged at the peripheral portion of the chip. Each input/output cell consists of a bonding pad, a p-channel MOS region and an n-channel MOS region, and extends inward from the side of the chip in a direction perpendicular to the side of the chip.

7 Claims, 6 Drawing Figures

SEMICONDUCTOR DEVICE HAVING A PLURALITY OF CMOS I/O CELLS LOCATED AT THE PERIPHERY OF THE CHIP ARRANGED IN A DIRECTION PERPENDICULAR TO THE SIDES OF THE CHIP

BACKGROUND OF THE INVENTION

This invention relates to a semiconductor device in which MOS elements are integrated.

Various MOS devices are widely used nowadays. FIG. 1 is a plan view showing a prior art MOS gate array. It can be seen that a gate array portion 12 is provided in the central portion of a chip 10. Also, a large number of input/output cells 14 are arranged along the periphery of the chip 10. The input/output cell 14 consists of a p-channel MOS region 16, a bonding pad 18 and an n-channel MOS region 20. It should be noted that a parasitic PNP transistor is formed in the region between the p-channel MOS region 16 and the n-channel MOS region 20, with the result that a latch-up phenomenon is caused between the regions 16 and 20. In order to prevent the difficulty, it is necessary to decrease the current amplification factor of the parasitic transistor by disposing the regions 16 and 20 sufficiently apart from each other. However, it is unavoidable to decrease the number of input/output cells 14 arranged along the periphery of the chip 10. If the number of cells is decreased, the number of bonding pads is also decreased, rendering it difficult to select the bonding pad to which a lead wire is to be connected. Thus, unsatisfactory bonding is likely to be caused. Further, the adjacent input/output cells 14 are opposite to each other in the arrangement of the p-channel MOS region 16 and the n-channel MOS region 20 so as to prevent the latch-up phenomenon between the adjacent cells. As a result, the bonding pads 18 are rendered nonuniformly apart from each other. Also, the input/output terminals of the regions 16 and 20 with respect to the gate array portion 12 are rendered nonuniformly apart from each other. Thus, the bonding operation and the wiring in the final step are rendered difficult.

SUMMARY OF THE INVENTION

An object of this invention is to provide a semiconductor device comprising a large number of bonding pads and free from a latch-up phenomenon. The object is achieved by a semiconductor device comprising a chip and a plurality of input/output cells each having a bonding pad, a first channel MOS element region and a second channel MOS element region, and extending inward from the side of the chip in a direction perpendicular to the side of the chip.

DETAILED DESCRIPTION OF THE PREFERRED EMBODIMENTS

Figure 1:
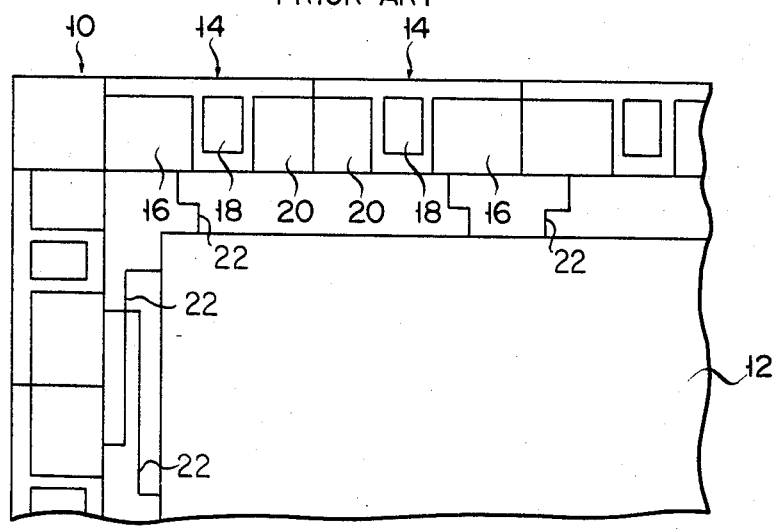
FIG. 1 is a plan view showing a prior art MOS gate array.
Figure 2:
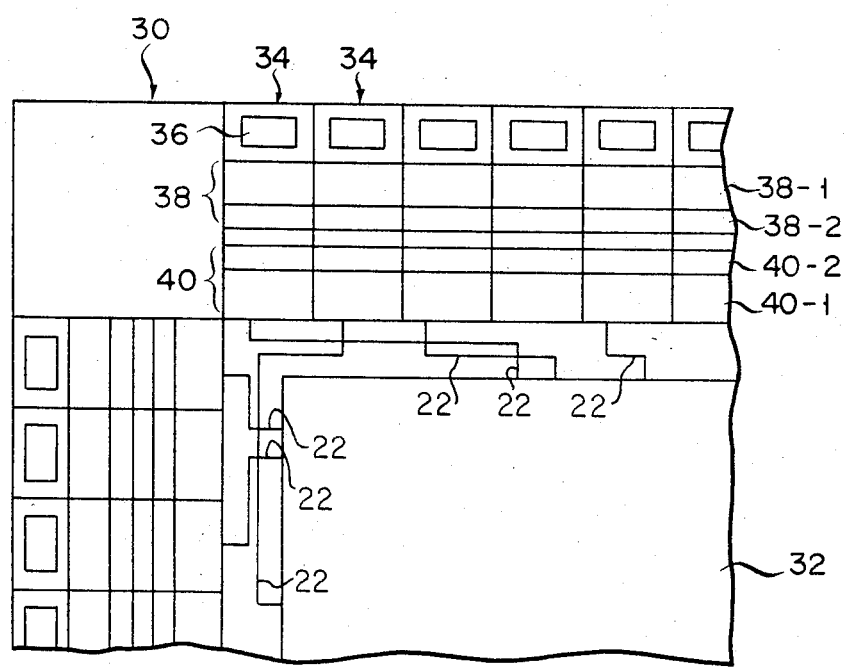
FIG. 2 is a plan view showing a MOS gate array according to an embodiment of this invention.

FIG. 2 shows the pattern of a MOS gate array according to an embodiment of this invention. It can be seen that a rectangular gate array portion 32, i.e., an integrated circuit portion, is provided in the central portion of a rectangular chip 30, e.g., an n-type semiconductor substrate. A large number of input/output cells 34 are formed along the periphery of the chip 30. Lead wires 22 are connected between input/output cell 34 and the gate array portion 12. The input/output cell 34 is provided with an input inverter, an input protection circuit, a pull-up resistor, a pull-down resistor, an output buffer, etc. As seen from the drawing, the input/output cell 34 extends inward from the side of the chip 30 in a direction perpendicular to the side of the chip 30, and comprises a bonding pad 36, facing the side edge of the chip 30, a p-channel MOS region 38 and an n-channel MOS region 40 arranged in the order mentioned. The p-channel MOS region 38 consists of an active element region 38-1 and a passive element region 38-2. Likewise, the n-channel MOS region 40 consists of an active element region 40-1 and a passive element region 40-2. The passive element region 38-2 and 40-2 are regions including, for example, poly-Si protective resistors, Al-wirings, etc. and, thus, do not cause a latch-up phenomenon. Since the passive element regions 38-2 and 40-2 are sandwiched between the active element regions 38-1 and 40-1, the p-channel active element region 38-1 and the n-channel active element region 40-1 are made sufficiently apart from each other.

In the construction described above, the p-channel MOS region 38 and the n-channel MOS region 40 are arranged to extend in a direction perpendicular to the side of the chip 30. In other words, the width of the input/output cell 34 along the side of the chip 30 is smaller than that of the prior art. As a result, the number of input/output cells per chip can be increased, leading to an increased number of bonding pads. Since the scope of choice of the bonding pads which are to be connected to a lead wire is widened, it is possible to suppress the unsatisfactory bonding. Also, since the input/output cells 34 are equidistantly provided, the wiring between the input/output cells 34 and the gate array portion 32 can be facilitated. Further, since the p-channel MOS region 38 and the n-channel MOS region 40 are arranged in a direction perpendicular to the side of the chip 30, the number of input/output cells 34 is not decreased even if the regions 38 and 40 are disposed sufficiently apart from each other to prevent a latch-up phenomenon.

The foregoing description covers a gate array as an example. But, the techincal idea of this invention can be applied to any kind of MOS device such as memory device. A p-well is provided in an n-substrate to form a CMOS structure in the embodiment described above. But, it is possible to provide an n-well in a p-substrate. A p-channel MOS region is formed adjacent to a bonding pad in the embodiment described above. It is also possible to form an n-channel MOS region adacent to a bonding pad. This invention is featured in that the bonding pad, p-channel MOS region and n-channel MOS region included in each input/output cell are arranged in a direction prependicular to the side of the chip.

Figure 3:
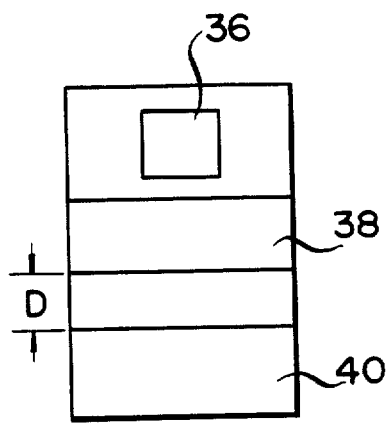
FIGS. 3 to 6 are plan views each showing a modification of the input/output cell shown in FIG. 2.
Figure 4:
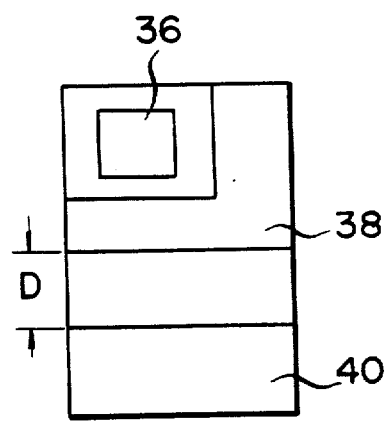
Figure 5:
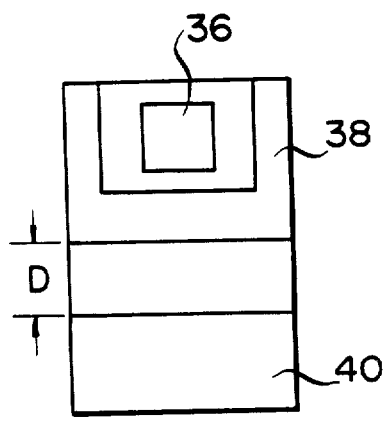
Figure 6:
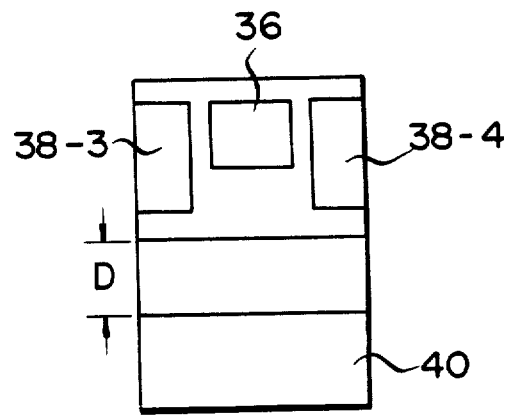

FIGS. 3 to 6 show modifications of the input/output cell shown in FIG. 2. The reference numerals used in the first embodiment will be used for corresponding elements in the modifications. In the modification of FIG. 3, each of the p-channel MOS region 38 and the n-channel MOS region 40 is not divided into active and passive element regions, and a sufficient distance D is provided between the regions 38 and 40 to prevent a latch-up phenomenon. The modification of FIG. 4 differs from that of FIG. 3 in that the p-channel MOS element region 38 partly extends along one side of the bonding pad 36. In the modification of FIG. 5, the p-channel MOS region 38 partly extends along both sides of the bonding pad 36. In the modification of FIG. 6, the p-channel MOS region is divided into two separate regions 38-3 and 38-4 which are provided on both sides of the bonding pad 36.

As described above in detail, this invention provides a MOS device which prevents a latch-up phenomenon without decreasing the integration density of the input-/output cells, density and facilitates the bonding and wiring operations.

What is claimed is:

1. A MOS gate array comprising:
   a semiconductor substrate of a first conductivity;
   an integrated circuit located in the center of said semiconductor substrate;
   a plurality of lead wires; and
   a plurality of CMOS input/output cells located along the peripheral portion of said semiconductor substrate, wherein said CMOS input/output cells are connected to said integrated circuit and each of said CMOS input/output cells includes
      a bonding pad located along the peripheral portion of said semiconductor substrate and connected to one of said plurality of lead wires,
      a first MOS region of a first channel type located adjacent to said bonding pad, and inward from said bonding pad and the edge of said semiconductor substrate in a perpendicular direction, and
      a second MOS region of a second channel type located adjacent to said first MOS region, and inward from said first MOS region and the edge of said semiconductor substrate in a perpendicular direction.

2. The semiconductor device according to claim 1, wherein each of the first and second channel type MOS regions is divided into an active element region and a passive element region, and the first and second channel type passive element regions are sandwiched between the first and second channel type active element regions.

3. The semiconductor device according to claim 1, wherein the first channel type MOS region partly extends along the side of the bonding pad.

4. The semiconductor device according to claim 1, wherein said first and second MOS regions include an output buffer, an input buffer, an input protective circuit, a pull-up resistor and a pull-down resistor, which are coupled within said first and second MOS regions and to said integrated circuit and said bonding pad.

5. A semiconductor device, comprising:
   a chip of N-type semiconductor material having a linear edge and a peripheral area adjacent to one edge of said chip;
   a plurality of discrete input/output cells formed along said peripheral area of said chip with said cells being spaced from said one edge of said chip, each of said cells having active and passive regions extending along spaced lines in a parallel relation to said edge of said chip;
   a plurality of bonding pads mounted on said chip between said cells and said one edge of said chip; and
   said bonding pads and said regions of said cell being aligned along lines running perpendicular to said edge of said chip.

6. A MOS gate array comprising:
   a semiconductor substrate of a first conductivity;
   an integrated circuit located in said semiconductor substrate; and
   a plurality of CMOS input/output cells located along a peripheral portion of said semiconductor substrate, wherein said CMOS input/output cells include
      a bonding pad located along the peripheral portion of said semiconductor substrate,
      a first MOS region of a first channel type located adjacent to and inward from said bonding pad and in a perpendicular direction to the edge of said semiconductor substrate, and
      a second MOS region of a second channel type located adjacent to and inward from said first MOS region and in a perpendicular direction to the edge of said semiconductor substrate.

7. A MOS gate array comprising:
   a semiconductor substrate of a first conductivity;
   an integrated circuit located in said semiconductor substrate; and
   a plurality of CMOS input/output cells located along a peripheral portion of said semiconductor substrate, wherein said CMOS input/output cells include
      a bonding pad located along the peripheral portion of said semiconductor substrate,
      a first MOS region of a first channel type located adjacent to and inward from said bonding pad and in a perpendicular direction to the edge of said semiconductor substrate wherein a porton of said first MOS region partially extends along the side of said bonding pad, and
      a second MOS region of a second channel type located adjacent to and inward from said first MOS region and in a perpendicular direction to the edge of said semiconductor substrate.

* * * * *

UNITED STATES PATENT AND TRADEMARK OFFICE
CERTIFICATE OF CORRECTION

PATENT NO. : 4,591,894

DATED : May 27, 1986

INVENTOR(S) : Susumu Kawakami

It is certified that error appears in the above-identified patent and that said Letters Patent is hereby corrected as shown below:

Figures 3-6 should be inserted as shown on the attached sheet.

Signed and Sealed this

First Day of September, 1987

*Attest:*

DONALD J. QUIGG

*Attesting Officer*   *Commissioner of Patents and Trademarks*